(12) United States Patent
Raj et al.

(10) Patent No.: US 12,020,766 B2
(45) Date of Patent: Jun. 25, 2024

(54) MEMORY CIRCUIT ARCHITECTURE WITH MULTIPLEXING BETWEEN MEMORY BANKS

(71) Applicant: QUALCOMM Incorporated, San Diego, CA (US)

(72) Inventors: Pradeep Raj, Uttar Pradesh (IN); Rahul Sahu, Bangalore (IN); Sharad Kumar Gupta, Bangalore (IN); Hemant Patel, Bangalore (IN); Diwakar Singh, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/654,295

(22) Filed: Mar. 10, 2022

(65) Prior Publication Data

US 2023/0290387 A1    Sep. 14, 2023

(51) Int. Cl.
  *G11C 7/10*    (2006.01)
  *G11C 7/06*    (2006.01)
  *G11C 7/12*    (2006.01)

(52) U.S. Cl.
  CPC .............. *G11C 7/1012* (2013.01); *G11C 7/06* (2013.01); *G11C 7/106* (2013.01); *G11C 7/1087* (2013.01); *G11C 7/1096* (2013.01); *G11C 7/12* (2013.01)

(58) Field of Classification Search
  None
  See application file for complete search history.

(56) References Cited

U.S. PATENT DOCUMENTS

| | | | |
|---|---|---|---|
| 5,682,343 A * | 10/1997 | Tomishima | G11C 7/18 365/208 |
| 6,738,279 B1 | 5/2004 | Kablanian | |
| 9,275,686 B2 | 3/2016 | Patel et al. | |
| 10,636,480 B2 | 4/2020 | Intrater et al. | |
| 10,867,681 B2 | 12/2020 | Clinton et al. | |
| 2002/0085423 A1* | 7/2002 | Tedrow | G11C 16/28 365/185.21 |
| 2002/0163033 A1 | 11/2002 | Sugawara et al. | |
| 2006/0209585 A1* | 9/2006 | Tanizaki | G11C 13/004 365/148 |
| 2008/0158941 A1* | 7/2008 | Choi | G11C 7/18 365/163 |
| 2008/0165564 A1* | 7/2008 | Namekawa | H01L 27/0207 365/96 |
| 2010/0070676 A1 | 3/2010 | Ryu | |
| 2010/0118593 A1* | 5/2010 | Cho | G11C 11/56 365/210.1 |
| 2011/0026292 A1* | 2/2011 | Narui | G11C 11/401 365/207 |
| 2020/0251164 A1 | 8/2020 | Pulluru et al. | |

OTHER PUBLICATIONS

International Search Report and Written Opinion—PCT/US2023/013903—ISA/EPO—dated Jun. 1, 2023.

* cited by examiner

Primary Examiner — J. H. Hur
(74) Attorney, Agent, or Firm — Haynes and Boone, LLP

(57) ABSTRACT

One implementation includes a random access memory (RAM) that has a muted multiplexing functionality. For instance, a RAM may be implemented having a first outer bank, a first inner bank, a second outer bank, and a second inner bank, each coupled to a controller. Multiplexing circuits for the outer banks may be disposed adjacent the outer banks and away from the controller, whereas the multiplexing circuits for the inner banks may be disposed within or adjacent to the controller.

15 Claims, 8 Drawing Sheets

MEMORY CIRCUIT ARCHITECTURE WITH MULTIPLEXING BETWEEN MEMORY BANKS

TECHNICAL FIELD

The present application relates, generally, to memory circuits and, more specifically, to memory circuit architecture placing multiplexing circuits between memory banks.

BACKGROUND

Computing devices may include random-access memory (RAM) implemented as static RAM (SRAM), dynamic RAM (DRAM), as well as various read-only memories (ROMs). RAM may be implemented within a processor, such as a central processing unit (CPU), graphics processing unit (GPU), or outside of a processor.

For a given memory design, there may be competition between density (i.e. area savings) and performance (i.e., speed). For instance, a multi-bank memory device may be designed to maximize density at the expense of an incremental amount of speed. On the other hand, a multibank memory device may be designed to increase the speed at the expense of an incremental amount of density.

Accordingly, there is a need in the art for memory architectures that achieve a better trade-off between performance and area.

SUMMARY

One implementation includes a random access memory (RAM). The random access memory also includes a first memory bank, a second memory bank, a third memory bank, and a fourth memory bank, all coupled to a centrally located controller; and a write driver and a sense amplifier, in the centrally located controller, coupled to the first memory bank, the second memory bank, the third memory bank, and the fourth memory bank via a plurality of global bit lines; wherein the third memory bank is positioned between the first memory bank on one side of the centrally located controller and the centrally located controller, and wherein the fourth memory bank is positioned between the second memory bank on the other side of the centrally located controller and the centrally located controller; wherein at least one first read multiplexer and at least one first write multiplexer coupled to the first memory bank are disposed on a far side of the third memory bank with respect to the centrally located controller; further wherein the plurality of global bit lines includes a first plurality of read data lines and a first plurality of write data lines coupling the centrally located controller to the at least one first read multiplexer and the at least one first write multiplexer.

Another implementation includes a method of operating a random-access memory (RAM) having a first inner memory bank, a first outer memory bank, a second inner memory bank, second outer memory bank, and a controller disposed between the first inner memory bank and the second inner memory bank, the method comprising: transmitting data from a write driver to the first outer memory bank through a first write multiplexer associated with the first outer memory bank, including: transmitting the data on a first plurality of write data lines that couple a controller of the RAM to the first write multiplexer; and transmitting data from the write driver to the first inner memory bank through a second write multiplexer associated with the first inner memory bank, including: transmitting the data on a second plurality of write data lines that couple the controller to the second write multiplexer, wherein the second write multiplexer is disposed between the controller and the first inner memory bank.

Another implementation includes a system on chip (SOC). The system includes a random-access memory (RAM) having a first inner memory bank, a first outer memory bank, a second inner memory bank, and second outer memory bank, wherein the first inner memory bank is positioned between the first outer memory bank and a controller of the RAM, and wherein the second inner memory bank is positioned between the second outer memory bank and the controller of the RAM; a distributed multiplexer system within the RAM, including a first outer multiplexer disposed on a first side of the first inner memory bank opposite the controller, a first inner multiplexer disposed between the first inner memory bank and a write driver and a sense amplifier of the controller of the RAM, a second inner multiplexer disposed between the second inner memory bank and the write driver and sense amplifier, and a second outer multiplexer disposed on a second side of the second inner memory bank opposite the controller; a first plurality of data lines coupling the controller to the first outer multiplexer; and a second plurality of data lines coupling the controller to the first inner multiplexer.

Another implementation includes a semiconductor device that has a first outer memory bank, a second outer memory bank, a first inner memory bank, and a second inner memory bank, all coupled to a controller, wherein the first inner memory bank is positioned between the first outer memory bank and the controller, and wherein the second inner memory bank is positioned between the second outer memory bank and the controller; means for writing data, disposed in the controller, and coupled to the first outer memory bank, the second outer memory bank, the first inner memory bank, and the second inner memory bank; means for sensing data, disposed in the controller, and coupled to the first outer memory bank, the second outer memory bank, the first inner memory bank, and the second inner memory bank; means for multiplexing data transmitted between the controller and the first outer memory bank, the second outer memory bank, the first inner memory bank, and the second inner memory bank, including: first multiplexing means serving the first outer memory bank and disposed on a first side of the first inner memory bank opposite the controller; second multiplexing means serving the first inner memory bank and disposed in the controller; third multiplexing means serving the second outer memory bank and disposed on a second side of the second inner memory bank opposite the controller; and fourth multiplexing means serving the second inner memory bank and disposed in the controller; and means for carrying data between the controller and the first multiplexing means, the second multiplexing means, the third multiplexing means, and the fourth multiplexing means.

DETAILED DESCRIPTION

Figure 1:
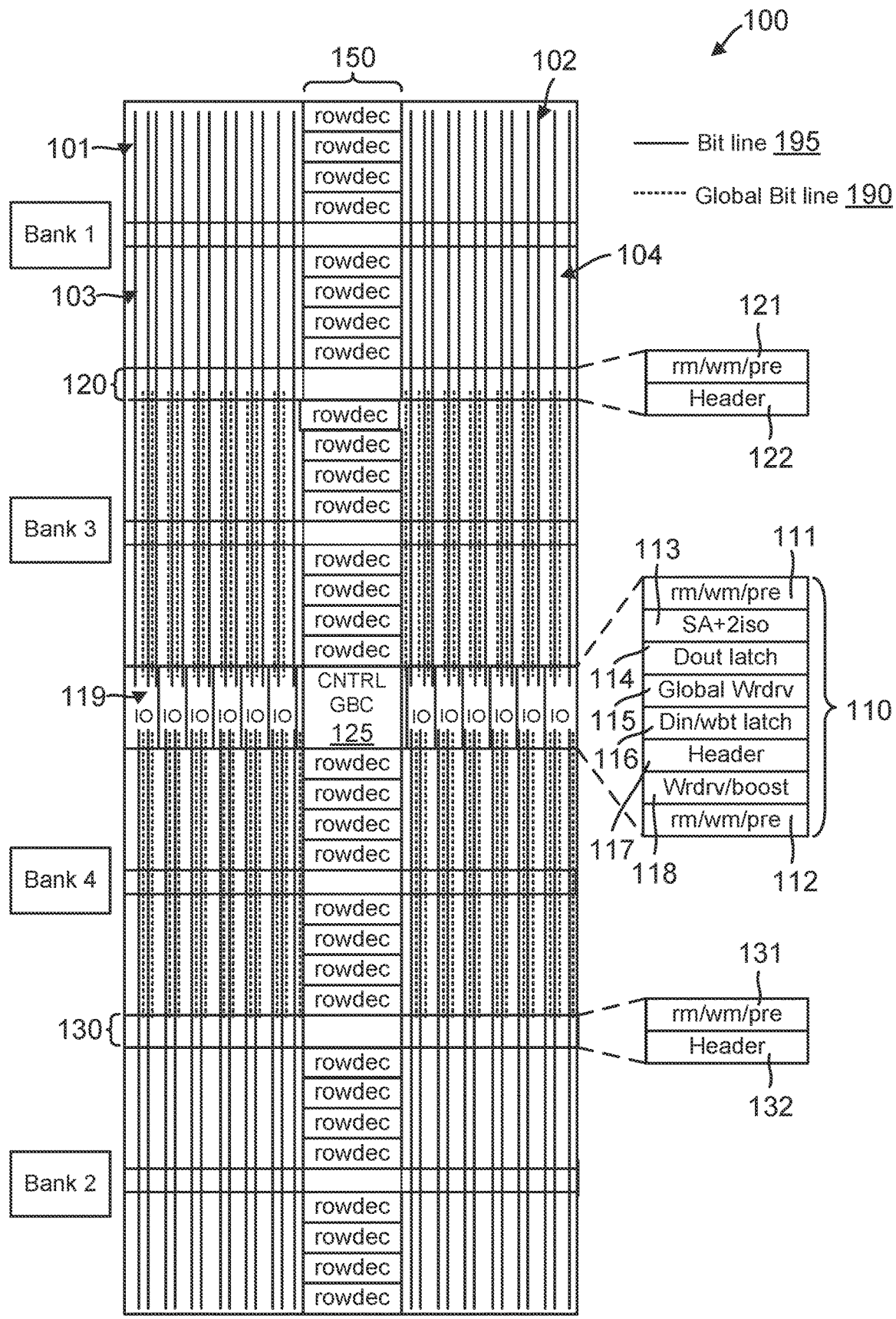
FIG. 1 is a simplified diagram illustrating an example memory circuit, according to one implementation.

Various implementations provided herein include a memory architecture that provides a better balance of performance and density than other solutions. An example of a solution is a high-density memory architecture that disposes a write driver, sense amplifier, and the multiplexing circuits for four memory banks within a central controller. The sense amplifier and write driver are located in the center of the architecture but support the four memory banks, thereby avoiding duplication of the sense amplifier and the write driver. However, a drawback of the high-density architecture is that when the multiplexing circuitry for the four memory banks is located in the center, it may then use conductive lines within higher metal layers to serve the outer memory banks. And since the conductive lines are between the multiplexer circuits and the memory banks, the number of conductive lines may be relatively large. Conductive paths that include multiple metal layers may incur greater parasitic resistance and capacitance than would be expected for conductive paths within a single metal layer. Therefore, the higher density architecture may include the drawback of greater parasitic capacitance and resistance within communication paths, thereby reducing a speed of the device.

Another example of another architecture is a high-speed memory architecture. The example high-speed memory architecture may also include a first inner/outer pair of memory banks on a first side of the central controller and a second pair of inner/outer memory banks on the second (opposite) side of the central controller. However, the high-speed memory architecture includes greater duplication of parts than does the high-density architecture. For instance, the high-speed memory architecture may place a sense amplifier and a write driver between the banks of the first inner/outer pair and another sense amplifier and another write driver between the banks of the second inner/outer pair. The multiplexing circuitry may also be disposed proximate the sense amplifiers and write drivers. The result is that sensing, driving, and multiplexing is placed closer to the individual memory banks than in the high-density architecture. The high-speed memory architecture may be more efficient with higher metal layer routing because it routes a lower number of global bit lines over the inner pair rather than routing a higher number of bit lines. Therefore, the high-speed architecture achieves lower parasitic resistance and capacitance in the communication lines and, thus, higher speed than the high-density architecture. However, the higher speed comes at the cost of less density through increased duplication.

Various implementations described herein provide an advantageous balance between speed and density compared with the other implementations. An example includes at least four memory banks. The centrally located controller includes a write driver and a sense amplifier that serve each of the different memory banks. The central controller may also include read multiplexer circuits and write multiplexer circuits to serve the inner two of the memory banks. The multiplexing circuits for the outer two of the memory banks are not disposed within the central controller but, rather, are disposed between the banks of each inner/outer pair. In other words, the multiplexing circuits for the outer two of the memory banks are disposed next to those outer memory banks.

The multiplexing circuits for the outer two memory banks may communicate with the write driver and sense amplifier circuits in the center through (upper or lower) metal layers that traverse physical paths across the inner two memory banks to the outer memory bank above, or under, the inner two memory banks. Nevertheless, the number of connections traversing the (higher/upper or lower) metal layers is lower than that of the high-density architecture because at least some of the multiplexing is moved outward and those multiplexers communicate with the sense amplifier and write driver using a smaller number of lines than would be expected of communication between multiplexers and the memory banks they serve. As a result, the communication paths have reduced parasitic resistance and capacitance compared to the high-density architecture. Also, such implementation may avoid duplicating the sense amplifier and write driver circuits, thereby remaining relatively dense compared to the high-speed architecture.

Continuing with the example, lines connecting the central controller to the outer multiplexing circuits may be made with separate masks to increase both write performance and read performance. For instance, lines used for writing may benefit from a reduced resistance. Various implementations may use a mask for the write lines in the (upper or lower) metal layers to make those lines wider to reduce resistance. Similarly, lines used for reading may benefit from a reduced capacitance, and those implementations may use a mask for the read lines to make those reading lines narrower.

Some implementations may include methods of operating a memory conforming to the architecture described above. In one example, a method may include performing a read operation on one of the outer memory banks by decoding address information in an outer bank, wherein the decoding causes read multiplexing circuitry that is located proximate the outer bank to multiplex bit line voltages. Memory bits are read from bit cells of the memory bank and then transmitted to a centrally located sense amplifier using metal lines that cross, e.g., are located above or below, an inner memory bank. In another example, the method may include performing a write operation on one of the outer memory banks. The data to be written to the outer memory bank is transmitted from centrally located write driver circuitry to write multiplexing circuitry located proximate the outer bank. The write operation includes decoding address information, including multiplexing bit line voltages according to decoded address information, and using the write multiplexing circuitry.

Various implementations may include advantages over other systems. For instance, various implementations of the present disclosure may provide a higher density by moving some of the components to the center of the memory device while providing higher performance by moving some of the multiplexing away from the center and tailoring the write lines and read lines individually to provide higher performance for reading and writing, respectively. Such architectural features may result in a device that has faster reading and writing than does the high-density architecture while at the same time being more efficient with silicon area than the high-speed architecture.

While the examples provided herein are toward memory architectures with four banks, the scope of implementations is not so limited. Rather, other implementations may scale the architecture to 8, 12, 16, or more memory banks by disposing multiplexing circuits away from the center and proximate the memory banks they serve.

FIG. 1 is a simplified diagram illustrating an example memory circuit 100, according to one implementation. Memory circuit 100 includes four memory banks Banks 1-4. Each of the Banks 1-4 may include four different memory cores. For ease of illustration, only the memory cores corresponding to Bank 1 are given reference numerals, but it is understood that the other banks, Banks 2-4, may be implemented in a similar manner. For instance, Bank 1 includes memory cores 101, 102, 103, 104, which in this example are static RAM (SRAM) cores, each including a multitude of memory cells (memory elements) arranged into rows (words) and columns (bits). At the intersection of each row and column is at least one bit cell. The scope of implementations is not limited to any size for the memory cores 101-104, as any appropriate size memory core may be adapted according to the principles described herein.

Centrally located controller 110 is physically located within the center of memory circuit 110, and it serves each of the memory banks (Banks 1-4). In other words, centrally located controller 110 may be located such that half (Banks 1 and 2) can be deemed as outer memory banks, and half (Banks 3 and 4) can be deemed as inner memory banks since they are located on either side of the controller 110 comparatively closer to center of the memory circuit than Banks 1 and 2. Centrally located controller 110 may include write driver 115 and sense amplifier 113. Centrally located controller 110 may further include write driver assist circuit (also referred to as boost circuit or write driver boost circuit) 118, data out latches 114, data in latches 116, and/or input/outputs (TO, exemplified by item 119). The input/outputs 119 provide data paths into and out of the memory circuit 100 for both read operations and write operations. For instance, the input/outputs 119 may include bumps or pins on an exterior of a chip or package that provide electrical communication with the latches 114, 116.

The sense amplifier 113 may include a plurality of individual sense amplifiers that, during a read operation, each receives a signal from one of the memory banks to sense either a digital one or a digital zero being read from a particular memory bit cell within a bank. During a write operation, the write driver 115 and write driver assist circuit 118 receive data from outside of the memory circuit 100 and convert the digital ones and digital zeros into voltages that are compatible with writing data into the bit cells of the memory banks. The centrally located controller 110 may further include a header 117. The header 117 may serve memory banks Bank 3-4. The header 117 may include one or more transistors that perform power gating for a given memory bank, thereby allowing a given memory bank to be powered down to save power for the device when that bank is not in use.

Centrally located controller 110 may further include global bank controller (GBC) 125, which may receive control instructions and addresses, pre-decodes those addresses and controls row decoders 150 to access particular wordlines within the exemplary memory cores 101-104 for both read and write access. In some implementations, the GBC 125 may include timing control logic, such as clock triggering, self-timing pulse-width control, and latching for clock signal generation. GBC 125 may also include operational mode decision logic, which may determine a read mode or a write mode, input signal latching for both data and control signals, sleep and power-up logic, etc.

A particular memory cell may be selected using a row decoder 150 as well as multiplexers 111, 112, 121, 131. Specifically, each of the multiplexers 111, 112, 121, 131 may select a particular bit line and bit line bar to address a particular memory cell. In this example, each of the multiplexers 111, 112, 121, 131 includes both read multiplexing (rm) circuitry and write multiplexing (wm) circuitry. The multiplexers 111 and 112 may be included in the centrally located controller 110. Precharging (pre) circuitry may be included as well. Note in FIG. 1 that multiplexers 121 and 131 serving the outer (with respect to the centrally located controller 110) banks (Banks 1, 2) are physically separate from the multiplexers 111 and 112 serving the inner (with respect to the centrally located controller 110) banks (Banks 3, 4). This is described in more detail with respect to subsequent Figures. The multiplexers 111, 112, 121, 131 are in communication with the memory cells as well as with the sense amplifier 113 and write driver 115 and write driver assist circuit 118.

The multiplexers 121, 131 may be physically located at the local data paths (LDPs) 120, 130, which serve the Banks 1, 2, respectively. The LDPs that include the multiplexers 111, 112 may be included within the centrally located controller 110 and are not shown separately. LDPs may also include bitline charging and resetting circuitry and the headers 117, 122, 132, respectively.

Each of the row decoders 150 may be selected by pre-decoded signals (not shown) output from the GBC 125. In one example, memory circuit 100 includes a time-sharing memory architecture in which the Banks 1-4 may be read from or written to during a same cycle of the clock signal. In some implementations, each of the cores within a given bank may be read from or written to during a same cycle of the clock signal.

Memory circuit 100 also includes global bit lines 190 and bit lines 195. Global bit lines 190 run between the multiplexers 111, 112, 121, 131 and the sense amplifier 113 and write driver 115 and write driver assist circuit 118. By contrast, bit lines 195 run between the multiplexers 111, 112, 121, 131 and the individual bit cells of the cores. The present implementation includes global bit lines 190, which serve Banks 1, 2, being routed in higher metal layers across Banks 3 and 4, respectively. However, the bit lines 195 that are associated with Banks 1 and 2 are not routed across Banks 3 and 4 because those bit lines 195 are coupled to the multiplexers 121, 131, respectively, and are routed to their respective Bank 1, 2. The paths of the global bit lines 190 and bit lines 195 are explained in more detail with respect to FIG. 2. Global bit lines 190 serving Banks 3 and 4 extend from the sense amplifier 113, and write driver 115 to the multiplexers 111, 112 in the centrally located controller 110.

The implementation of FIG. 1 corresponds to a 128×256 memory, where 128 is the number of wordlines, and 256 is the number of I/Os. Other implementations may scale the number of wordlines and input and output pins as appropriate and may adopt any register transfer level (RTL) or other technology.

Figure 2:
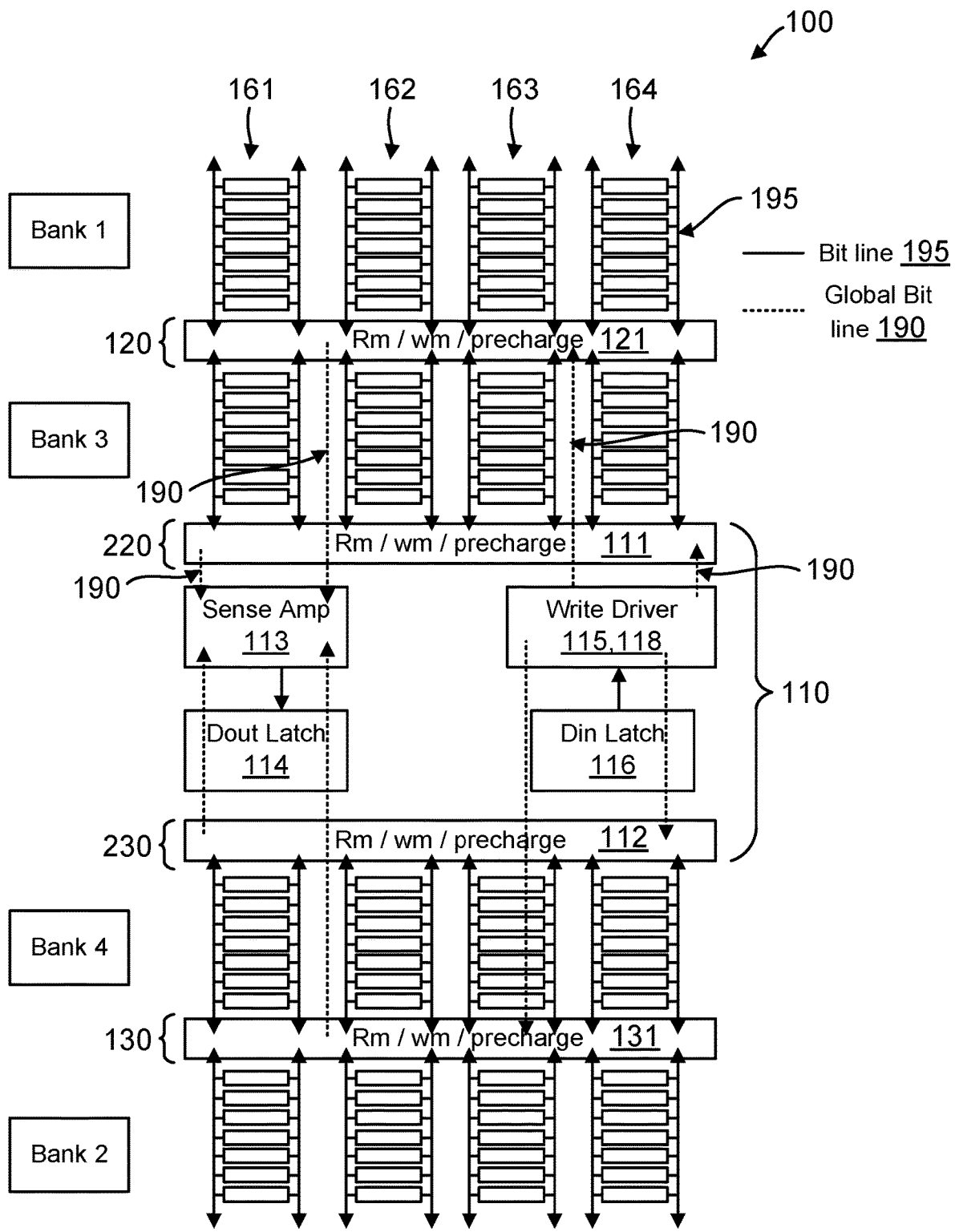
FIG. 2 is an illustration of the example memory circuit of FIG. 1, according to one implementation.

FIG. 2 is an illustration of memory circuit 100, according to one implementation, and providing a simplified, schematic view of memory circuit 100. FIG. 2 shows the LDPs 220, 230, which serve Banks 3, 4, respectively. The LDPs 220, 230 are located within or at least adjacent to centrally located controller 110. Looking at Bank 1, it includes four columns 161-164, each coupled to the multiplexing circuitry of LDP 120 by bit lines 195. Bit lines 195 are too numerous to provide reference numerals for all of them within FIG. 2, but it is understood that the other columns in Bank 1 and in the other Banks 2-4 have a similar structure with similar bit lines 195.

The outer (with respect to centrally located controller 110) banks, Banks 1, 2, are arranged so that they are served by the read multiplexing (Rm), write multiplexing (wm), and precharging circuitry 121, 131 of LDPs 120, 130, respectively. The inner (with respect to centrally located controller 110) banks, Banks 3, 4 are arranged so that they are served by the read multiplexing, write multiplexing, and precharging circuitry 111, 112 of LDPs 220, 230, respectively.

Looking at the read multiplexing, write multiplexing, and precharging circuitry 121, it is coupled to the sense amplifier 113 (for reading) and coupled to the write driver 115 (for writing) by global bit lines 190. Similarly, the read multiplexing, write multiplexing, and precharging circuitry 131 is coupled to the sense amplifier 113 and coupled to the write driver 115 by global bit lines 190. The global bit lines 190 that couple circuitry 121, 131 to the sense amplifier 113 and write driver 115 are routed in one or more higher metal layers across Banks 3 and 4, respectively. For instance, whereas bit lines 195 may be routed in a metal layer M0 or M1, the global bit lines 190 that couple circuitry 121, 131 to the sense amplifier 113 and write driver 115 may be routed in metal layer M2 or higher. Put another way, the global bit lines 190 that couple circuitry 121, 131 to the sense amplifier 113 and write driver 115 are routed in metal layers that are higher, i.e. more distant from a base layer (such as the transistor layer 601 in FIG. 6) or a substrate. For the sake of simplicity, these higher metal layers are referred to in the following as being provided above metal layers that are used for other lines, such as bit lines 195 (keeping in mind that the orientation of the memory circuit 100 may be inverted such that the higher metal layers are provided below the metal layers that are used for other lines, such as bit lines 195).

A consequence of routing data lines, such as global bit lines 190, in higher metal layers is that parts of those data lines may also be routed in lower bit lines and coupled by vias to the higher-layer bit lines, thereby incurring capacitance attributable to both metal layers. The higher capacitance may result in lower performance, especially in read operations but also in write operations. Note that the global bit lines 190 that couple the sense amplifier 113 and write driver 115 to the LDPs 220, 230 need not be routed through higher metal layers because they are routed on short paths that do not traverse a memory bank.

Various implementations provide an advantage by distributing the multiplexers throughout memory circuit 100 so that the multiplexers are close to the memory banks which they serve. In an alternate scenario in which Bank 1 is served by multiplexers that are further away e.g., as in LDP 220, then bit lines, rather than global bit lines, would be routed across Bank 3 in the higher metal layers. Since there are more bit lines than there are global bit lines, and since there is a finite width for routing data lines in those higher metal layers, routing bit lines may cause more engineering challenges and result in more compromises. For instance, routing a large number of bit lines within a finite routing space may result in narrower wires being used to implement those bit lines and narrower wires may incur greater resistance and further decrease performance. By contrast, having a smaller number of global bit lines within the same finite routing space may allow at least some of those wires to be wider, thereby allowing some implementations to have more freedom to reduce capacitance and/or resistance as appropriate. This is explained in more detail with respect to FIG. 3.

Figure 3:
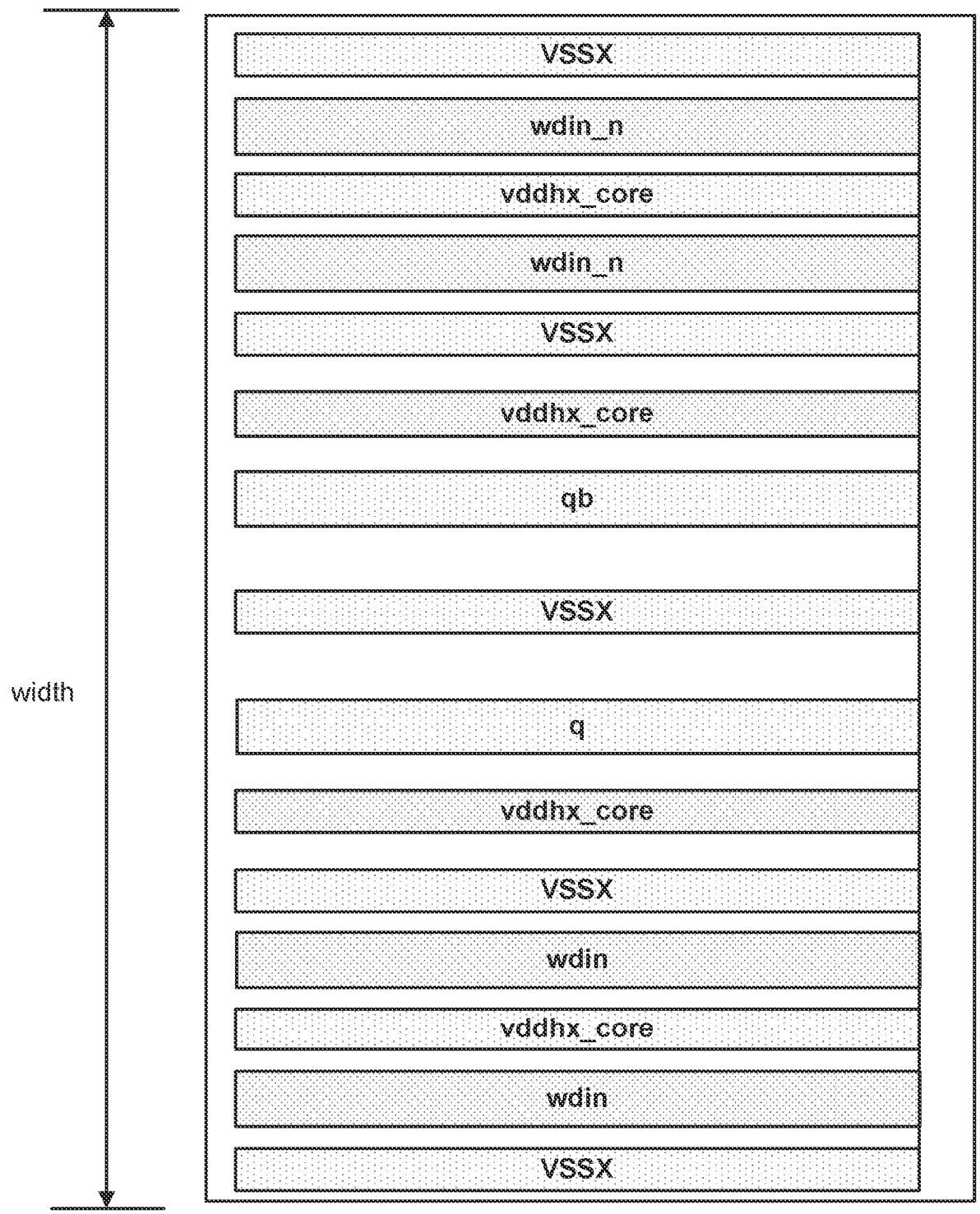
FIG. 3 is an illustration of example conductors in a metal layer in the example memory circuit of FIGS. 1-2, according to one implementation.

FIG. 3 is an illustration of wires routed on higher metal layers, as may be performed in the implementations of FIGS. 1 and 2. FIG. 3 is offered to show how wires may be laid within a metal layer (e.g., M2 of FIG. 6), and FIG. 3 is drawn approximately to scale. For instance, FIG. 3 is used to illustrate how wires would be laid within a metal layer above and across Bank 3 or Bank 4 of FIG. 2, as those wires traverse the longest dimension of device 100.

First, the wires VSSX are coupled to power and are not associated with data. The same is true for the wires vddhx_core. The remaining wires labeled wdin, wdin_n, q, and qb are data lines, shown as global bit lines 190 in FIGS. 1-2. These are complementary data lines, so that the write data is transmitted over wdin and wdin_n, and the read data is transmitted over q and qb.

Further in this example, read operations may benefit from less capacitive wires, whereas write operations may benefit from less resistive wires. Beneficial wire widths are implemented in the example of FIG. 3. For instance, the wire wdin is shown as two separate metal traces, as is the wire wdin_n. Making a wire from more than one metal trace in this instance reduces resistance at the cost of increasing capacitance, but such trade-off may be advantageous for write operations. Now looking to the read data lines q, qb, they are routed with a single trace each, thereby reducing capacitance but increasing resistance, and such trade-off may be advantageous for read operations.

Of course, employing different widths is not limited to the example of FIG. 3. Other implementations may be used as well, such as using one trace per data line and having variation in the widths of the traces. So in the example of FIG. 3, wdin and wdin_n might instead be formed from one larger-width trace each. In yet another example, a combination of trace numbers and trace widths may be used. For instance, a width of the traces may vary, and each data line can be implemented with one or more traces, thereby providing two ways to vary the effective width of the data line. In the above examples, the total (combined) width of the one or more write lines may be larger than the total (combined) width of the one more read data lines.

Using different widths for the read data lines and the write data lines may allow a beneficial trade-off between resistance and capacitance in these examples. The ability to use the different widths in this example is due at least in part to using a reduced number of wires within the higher metal layers. For instance, another implementation that routes bit lines (rather than global bit lines) might route 8, 16, or higher number of wires because of the multiplicity of bit lines used in the columns. However, in the present implementation, the multiplexers 121, 131 perform X:1 multiplexing (where X is an integer) thereby reducing the number of wires from the write driver 115, 118 to the multiplexers 121, 131 and from the sense amplifier 113 to the multiplexers 121, 131. The reduced number of wires within the finite width allows some wires to be made wider than other wires.

Various implementations may construct the wires using any appropriate technique. For instance, during semiconductor processing, the wires used for writing may be made with a different mask than the wires used for reading. The different masks may, e.g., allow for different widths of those wires. Of course, the scope of implementations is not limited to using different masks.

The ability to use different widths for different data lines may lead to higher performance than would be expected from a higher density device that places all of its multiplexing within the center of the memory circuit. Specifically, the ability to lower capacitance for read operations and to lower resistance for write operations may lead to a higher throughput than would be expected for a device that routes bit lines in the higher metal layers. Furthermore, such performance may be achieved without substantial increase in semiconductor area for memory circuit 100. Even though the multiplexing is distributed about the memory circuit 100, it can be done without also duplicating sense amplifiers 113 and write drivers 115. Therefore, the implementations described in FIGS. 1-7 may provide relatively high performance at a relatively small price in semiconductor area.

Now returning to FIG. 2, the global bit lines 190 serving Banks 1, 3 and the bit lines 195 serving Banks 1, 3 have been described. It is understood that multiplexer 112 is configured similarly to multiplexer 111 to serve Bank 4. Similarly, it is understood that multiplexer 131 is configured similarly to multiplexer 121 to serve Bank 2. The various bit lines 195 and global bit lines 190 are routed in the same way as described above. For instance, global bit lines 190 are routed in a higher metal layer across Bank 4 to couple the sense amplifier 113 and the write driver 115 to multiplexer 131 at LDP 130 to serve Bank 2, whereas the bit lines 195 coupled to multiplexer 112 are shorter and may not be routed in higher metal layers. Furthermore, the bit lines 195 associated with Banks 3, 4 are also not routed through higher metal layers because of the proximity of a given multiplexer to the bank which it serves.

Figure 4:
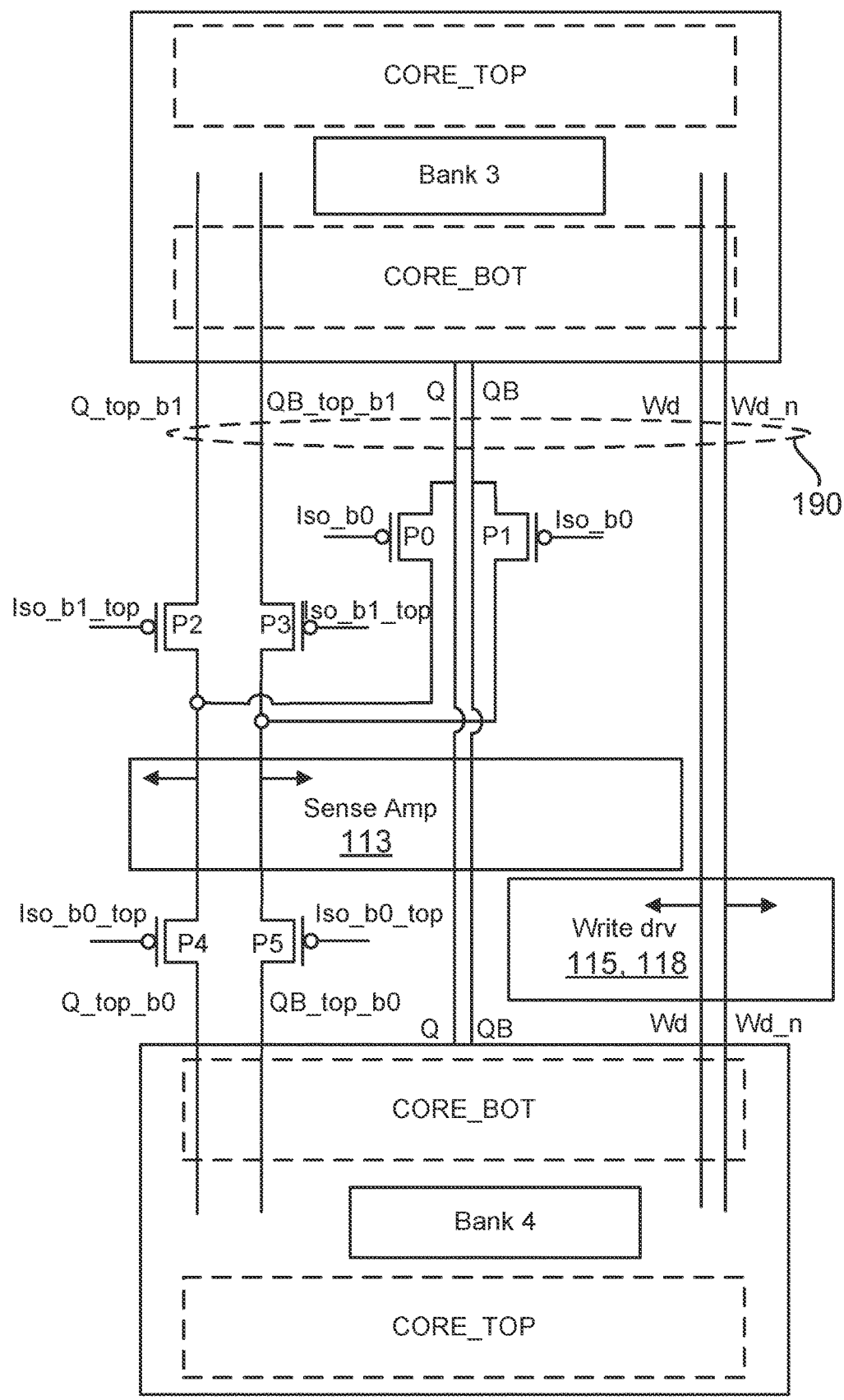
FIG. 4 is an illustration of a portion of the example memory circuit, according to one implementation.
Figure 5:
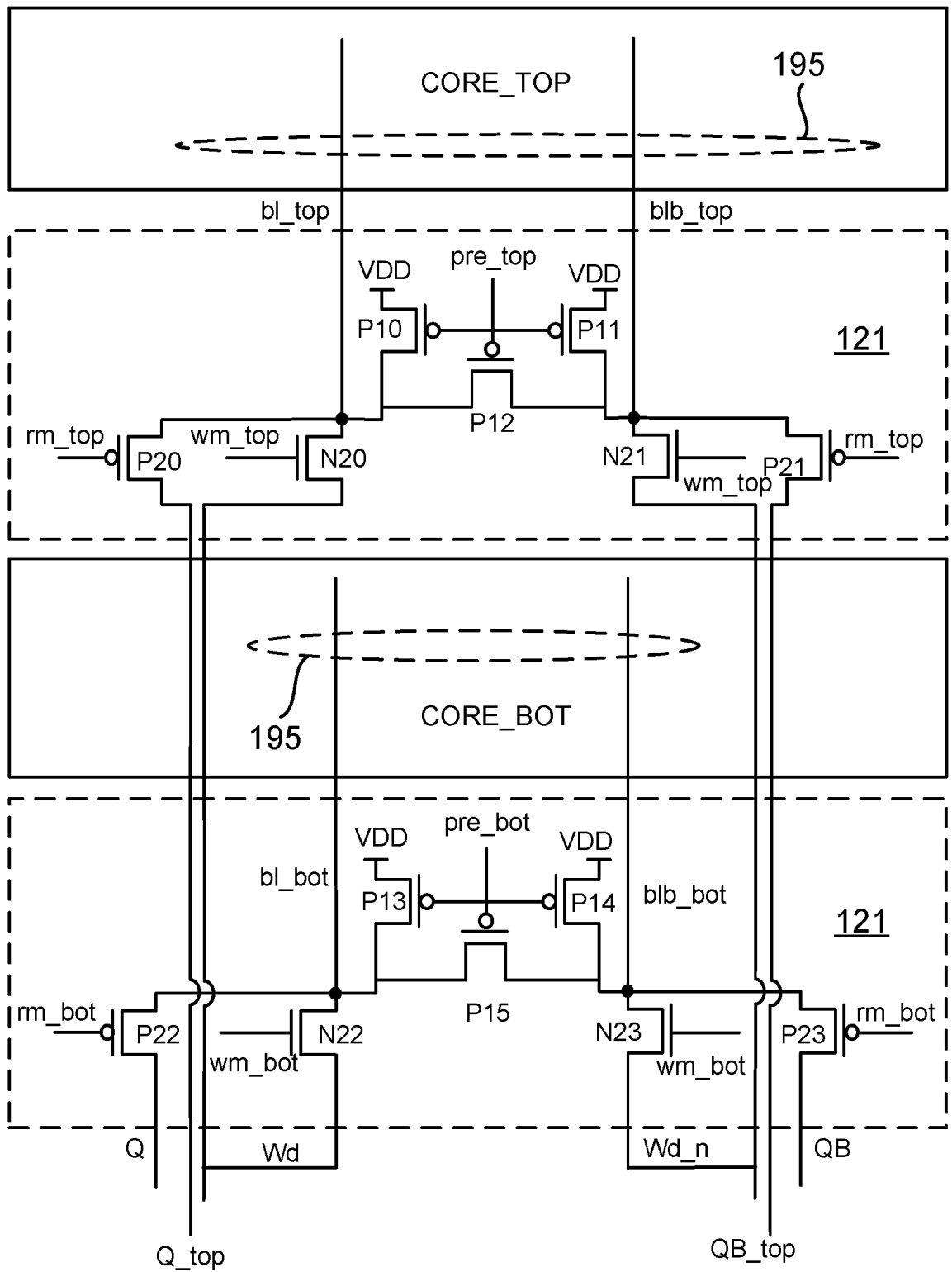
FIG. 5 is an illustration of a portion of the example memory circuit, according to one implementation.

FIGS. 4 and 5 are illustrations of portions of the memory circuit 100, according to one implementation, and proffered to show relationships between different components and different signals. FIG. 4 shows Banks 3, 4 coupled to global bit lines 190 and to sense amplifier 113 as well as write driver 115 and write assist circuits 118. Alternatively, FIG. 4 could instead show Banks 1, 2 with the understanding that Banks 3, 4 are omitted for simplicity. In any event, the relationship between the signals and the cores in FIGS. 4-5 are the same for each of the banks, Banks 1-4, in FIGS. 1-2.

Sense amplifier 113 serves each of the banks and each of the cores by receiving the signals Q_top_b0, QB_top_b0, Q_top_b1, QB_top_b1, Q, QB. The signals Q, QB are received from a bottom core in each bank (such as core 103 or 104 of Bank 1 in FIG. 1), whereas Q_top, QB_top are received from a top core in each bank (such as core 101 or 102 of Bank 1 in FIG. 1). A read operation may include providing a digital zero to two or more of the transistors, e.g., p-type metal oxide semiconductor (PMOS) transistors, to create a closed circuit between a particular bit cell and sense amplifier 113. For instance, performing a read operation from a bottom core may include providing a digital zero as control signal lso_b0 to turn transistors P0, P1 on. Otherwise, P0, P1 may be turned off. Similarly, reading from a top core may include providing a digital zero as lso_b1_top or lso_b0_top to turn on either the P2/P3 pair or the P4/P5 pair, otherwise those transistors may be turned off. The lso control signals may be provided by any appropriate component, such as GBC 125 (FIG. 1). That is true of each of the different control signals in FIGS. 4-5. Although only a single PMOS pair (P2/P3 and P4/P5) are shown to read each bank, other implementations may include a further PMOS pair for the bottom cores of Banks 3 and 4 to allow for independent read operations of the bottom cores of Banks 3 and 4.

The write driver 115 provides signals Wd, Wd_n at a voltage associated with writing to the different banks. In a scenario in which the global bit lines 190 are provided to the inner banks (Banks 3, 4), the global bit lines 190 may be routed within any appropriate metal layer, but perhaps in lower metal layers M0 or M1. In a scenario in which the global bit lines 190 are provided to the outer banks (Banks 1, 2), the global bit lines 190 may be routed in a higher/upper metal layer, such as M2, in addition to one of the lower metal layers. The implementations of FIGS. 1-2 include both scenarios.

Now looking to FIG. 5, it shows an example relationship between the global bit lines and the multiplexers for any one of the banks, Banks 1-4. For ease of illustration, this example will focus on Bank 1, and it is understood that the other banks, Banks 2-4, may operate in a similar way. Furthermore, FIG. 5 shows an example for a single column within the bank, and it is understood that other columns within the bank may operate in the same or similar way.

FIG. 5 shows a top core (CORE_TOP), such as core 101 or 102 in FIG. 1, and a bottom core (CORE_BOT), such as core 103 or 104 in FIG. 1. It is noted that the examples of FIGS. 1-2 show examples having four cores per bank, which is not inconsistent with FIGS. 4-5. Rather, the example of FIGS. 4-5 may be scaled so that a given bank has two top cores and two bottom cores, like FIGS. 1-2, and the multiplexing and precharging functionality is scaled accordingly.

In this implementation, the multiplexing circuitry 121 is in two parts—one for each of the cores. This may be scaled to an implementation including four cores within a bank by scaling the multiplexing circuitry to four parts. The bit lines 195 are illustrated as bl_top, blb_top, bl_top, blb_bot, and they are coupled with multiplexer 121 as well as with individual bit cells within the respective cores. The bit lines 195 provide complementary values to the individual bit cells within the respective cores.

Precharging circuitry is shown as including (e.g., PMOS) transistors P10-P15, where a signal pre_top may take a value of digital zero to turn on transistors P10-P12 and a signal signal pre_bot may take a value of digital zero to turn on transistors P13-P15, thereby applying the voltage from the power supply (e.g., VDD) to the bit lines 195. Otherwise, the transistors P10-P15 may be turned off. Precharging may be used during a read operation, as appropriate.

Multiplexing functionality is provided by the (e.g., PMOS) transistors P20-P23 and (e.g., NMOS) transistors N20-N23. Looking at the top core, during a read operation, transistors P20 and P21 may be turned on at least long enough to read a complementary bit from the particular bit cell selected by the row decoder (as in FIG. 1). Transistors P20 and P21 may be turned on using control signal rm_top. In this example, a given column may be selected by turning on its read multiplexer transistors using a read multiplexing (rm) signal, and it is understood that there would be a separate rm signal for each column. In such an example, the controller (e.g., GBC 125) may select a given column by turning on its transistors while leaving off corresponding transistors in other columns (not shown).

Similarly, during a write operation in the top core, transistors N20 and N21 may be turned on at least long enough to perform the write into the selected bit cell, using control signal wm_top, while the other transistors remain off. Once again, the particular column may be selected by the controller turning on transistors N20 and N21 while leaving off corresponding transistors in other columns. The multiplexing signals in both the top core and the bottom core may be provided by the controller (e.g., GBC 125) or other appropriate component.

A similar process may be performed in the bottom core. Specifically, a read operation in the column may include selecting the column by using rm_bot to turn on transistors P22 and P23 long enough to perform the read while leaving off corresponding transistors in other columns. A write operation on the column may include selecting the column by using wm_bot to turn on transistors N22 and N23 while leaving off corresponding transistors in other columns.

FIG. 5 is offered to show at least one example of a spatial relationship between the multiplexer 121 that serves a bank and the bit cells in the bank. As shown in FIG. 5, the multiplexer 121 may be divided into one portion per core, and that portion may be placed adjacent its corresponding core. Put another way, the LDP (e.g., LDP 120) for a given bank may conform to the architecture shown in FIG. 5. Of course, the scope of implementations is not limited to the architecture shown in FIG. 5, as any appropriate architecture may be used. For instance, the bottom core or top core may share a multiplexer and precharging circuit in other implementations.

Figure 6:
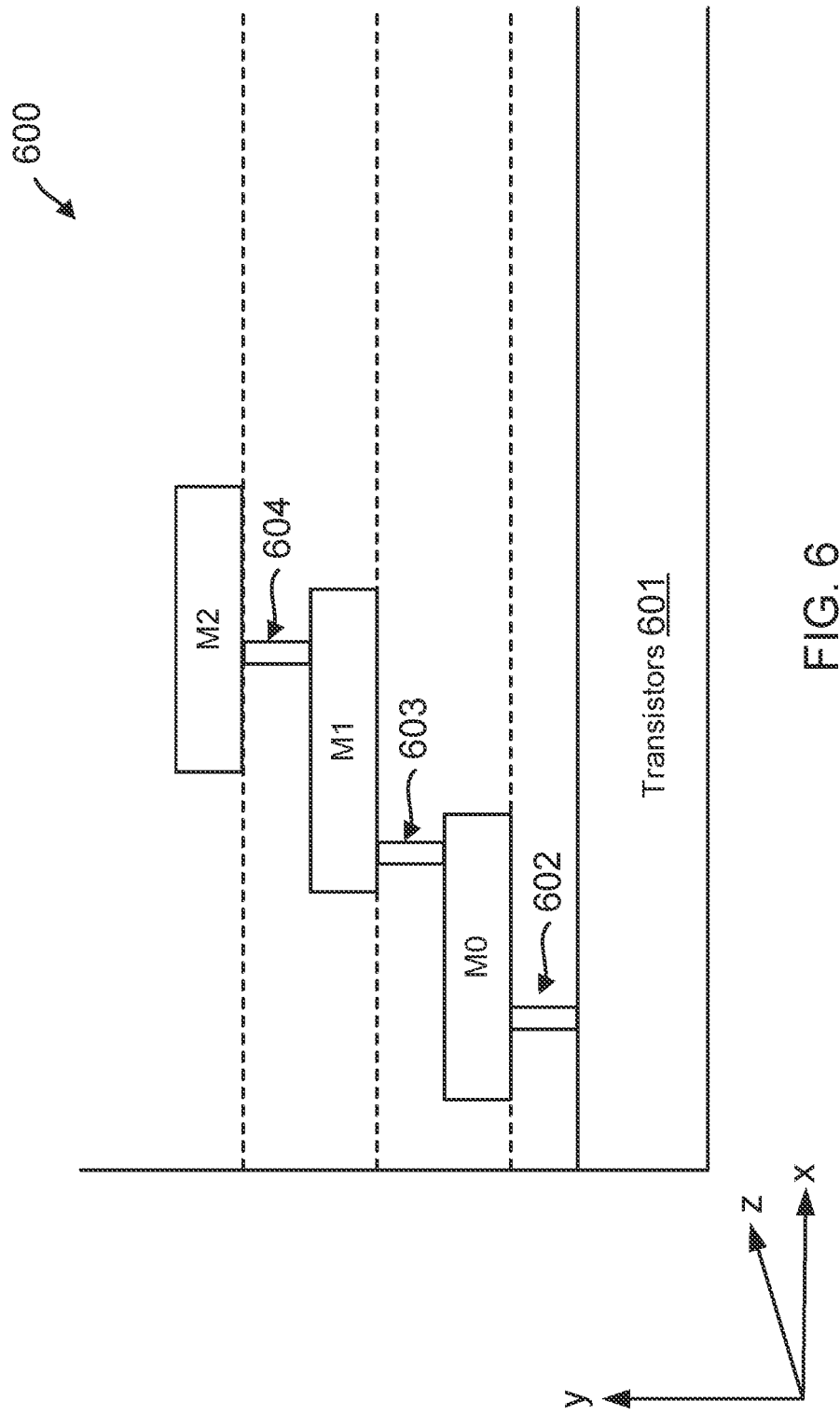
FIG. 6 is an illustration of example metal layers in a semiconductor device, such as in the example memory circuit of FIG. 1, according to one implementation.

FIG. 6 is an illustration of example semiconductor device 600, according to one implementation. The memory described above with respect to FIGS. 1-5 may be built according to the illustration in FIG. 6.

The example of FIG. 6 includes a layer of transistors 601 formed on a semiconductor substrate. For instance, the transistors 601 may illustrate transistors that form bit cells in the memory banks, the transistors of the multiplexers, the transistors of the drivers, sense amplifiers, and the like.

The transistors 601 form logic circuits, power circuits, memory circuits, and the like which communicate with other circuits within the layer of transistors 601 as well as with resources/circuits (not shown) outside of the semiconductor device 600. Electrical communication is facilitated by vias 602-604 and metal layers M0-M2. For instance, via 602 may electrically couple a particular terminal of a transistor to metal layer M0, and M0 may be patterned to couple that particular transistor to another transistor by another via (not shown) or may couple that particular transistor to metal layer M1 through via 603. Metal layer M1 may be patterned in any particular manner and may couple to layer M0 through any of a multitude of vias exemplified by via 603. Similarly, metal layer M2 may be patterned in any particular manner and may couple to layer M1 through any of a multitude of vias exemplified by via 604.

Physical conductor routing may be performed in any appropriate manner. As noted in the examples above, some of the global bit lines 190, which are implemented in metal layers across (e.g., above or below) Bank 3 and Bank 4, may use higher metal layers. An example of a higher metal layer includes M2. As also explained above, a conductive path that uses M2 may include additional capacitance attributable to the lower metal layers M0, M1 and vias 602-604. By contrast, bit lines 195 may use conductors within the lower metal layers M0, M1 and avoid using the higher metal layers.

Of course, the specific numbers given in the implementation of FIG. 6 are for example only. For instance, a given semiconductor device 600 may include more or fewer metal layers. Furthermore, those metal layers may be patterned in ways that are not easily shown in the X-Y plane of FIG. 6, but it is understood that FIG. 6 provides a simplified view of metal layers M0-M2 separated by dielectric material and transistors 601 which may be implemented as various devices. It is also understood that FIG. 6 is not drawn to scale. According to one implementation, at least two metal layers may be provided wherein a first metal layer (e.g., M0) of the at least two metal layers is provided closer to the layer of transistors 601 than a second metal layer (e.g., M2) of the at least two metal layers. For the sake of simplicity, the first metal layer may be referred to as a lower metal layer and the second metal layer may be referred to as a higher/upper metal layer. Structures of the metal layers may be embedded in a respective insulating layer and/or separated from each other by at least one insulating layer. As described above, vias 602-604, e.g., using through-holes, may be provided to (vertically) connect the structures, such as electrical leads or conductive paths, of the metal layers.

Various implementations described herein may be suitable for use in a system on chip (SOC). An example of a SOC includes a semiconductor chip having multiple processing devices within it, including a graphics processing unit (GPU), a central processing unit (CPU), a modem unit, a camera unit, and/or the like. In some examples, the SOC may be included within a chip package, mounted on a printed circuit board, and disposed within a portable device, such as a smart phone or tablet computer. However, the scope of implementations is not limited to a chip implemented within a tablet computer or smart phone, as other applications are possible.

Figure 7:
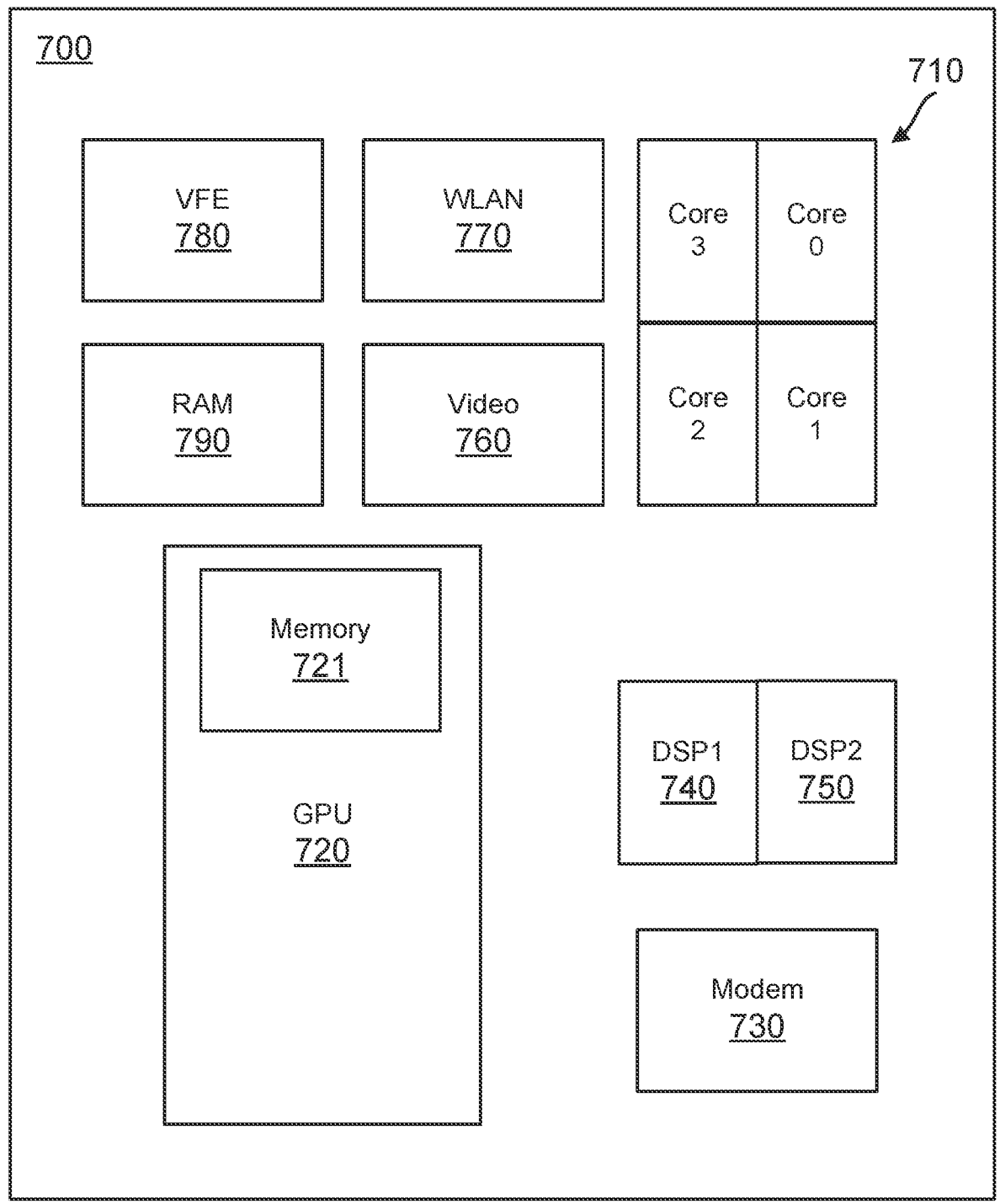
FIG. 7 is an illustration of an example system on chip (SOC), in which memory circuits, such as those illustrated in FIGS. 1-6, may be built according to one implementation.

FIG. 7 is an illustration of example SOC 700, according to one implementation. In this example, SOC 700 is implemented on a semiconductor die, and it includes multiple system components 710-790. Specifically, in this example, SOC 700 includes CPU 710 that is a multi-core general-purpose processor having four processor cores, core 0-core 3. Of course, the scope of implementations is not limited to any particular number of cores, as other implementations may include two cores, eight cores, or any other appropriate number of cores in the CPU 710. SOC 700 further includes other system components, such as a first digital signal processor (DSP) 740, a second DSP 750, a modem 730, GPU 720, a video subsystem 760, a wireless local area network (WLAN) transceiver 770, and a video-front-end (VFE) subsystem 780.

SOC 700 also includes RAM memory circuit 790. In this example, RAM memory circuit 790 may include one or more memory circuits that correspond to the architectures described above with respect to FIGS. 1-6. The implementations described herein may be adapted for use in any RAM memory circuit. For instance, in this example SOC 700 may include standalone RAM memory circuit 790, and there may be other RAM components in other processing units, such as GPU 720, modem unit 730, DSPs 740, 750, or the like. Those RAM components may also be adapted according to the architectures described above with respect to FIGS. 1-6.

As noted above, SOC 700 may include a CPU 710 having multiple cores 0-3, and one or more of those cores may execute computer-readable code providing the functionality of an operating system kernel. Furthermore, the example operating system kernel may include memory management logic that may perform read and write operations on various memory circuits, such as RAM memory circuits described herein. Accordingly, the principles described with respect to FIGS. 1-6 and 8 may be implemented in SOC 700 and, more specifically, the circuits and methods shown in FIGS. 1-6 and 8 may be implemented in SOC 700 or other chip to provide memory read and write functionality. For instance, an operating system kernel with memory management logic may perform a read or write operation to cause RAM memory to either read or write, as described above.

Figure 8:
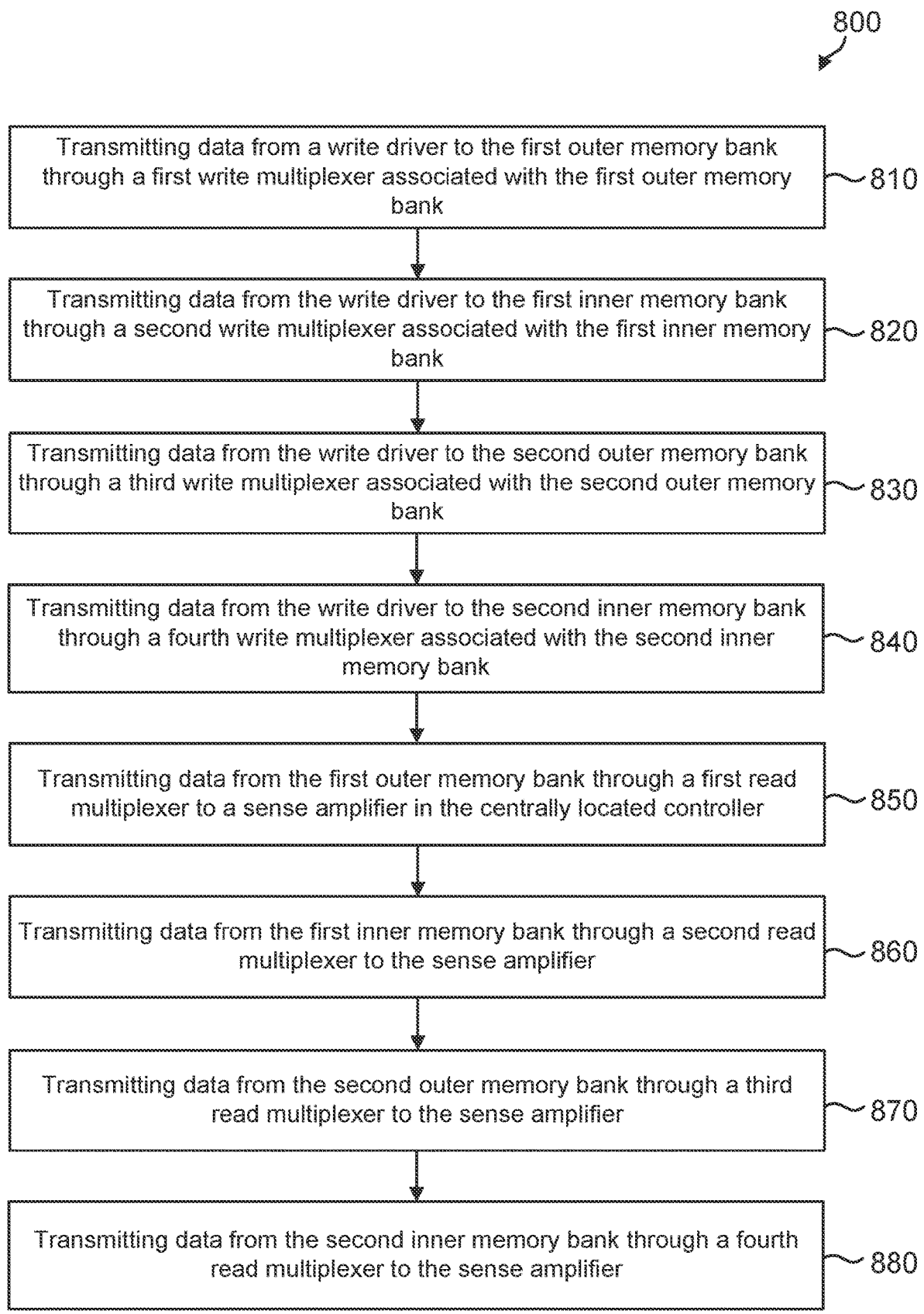
FIG. 8 is an illustration of a method of operating the memory circuits of FIGS. 1-8, according to one implementation.

A flow diagram of an example method 800 of performing reads and writes is illustrated in FIG. 8, according to one implementation. In one example, method 800 is performed by the RAM architecture described above with respect to FIGS. 1-7. In some examples, a memory management unit either within or outside of a CPU or GPU includes processing circuitry that executes computer readable instructions to perform a read or write operation on a RAM memory circuit by controlling a centrally located controller (e.g., centrally located controller 110 of FIG. 1). For instance, logic in a CPU or a GPU may send address and control signals to a centrally located controller to cause the centrally located controller to either read or write data.

Actions 810-840 describe a write operation, whereas actions 850-880 describe a read operation. It is to be understood that the implementations may perform reads before writes or alternate reads and writes as appropriate.

At action 810, the method includes transmitting data from a write driver to a first outer memory bank through a first write multiplexer associated with the first outer memory bank. An example is shown in FIGS. 1-2 in which the Bank 1 is a first outer bank. The data may be transmitted on write data lines coupling the centrally located controller to a first write multiplexer. The write data lines may be disposed in a metal layer across (e.g., above or below) a first inner memory bank (e.g., Bank 3) and traverse the first inner memory bank.

Action 820 may include transmitting data from the write driver to the first inner memory bank through a second write multiplexer associated with the first inner memory bank. An example is shown in FIGS. 1-2 in which Bank 3 is a first inner bank. Also, in this example, the second write multiplexer is disposed between the centrally located controller and the write driver. In other words, multiplexing is distributed about the physical architecture of the RAM so that multiplexing for the first inner memory bank may be located within or adjacent to the centrally located controller, whereas multiplexing for the first outer memory bank may be located adjacent to the first outer memory bank and outside of the centrally located controller, such as illustrated in FIGS. 1-2. The data may be transmitted on global bit lines.

At action 830, the method includes transmitting data from the write driver to a second outer memory bank through a third write multiplexer associated with the second outer memory bank. An example is shown in FIGS. 1-2 in which the second outer memory bank is Bank 2, and it is served by multiplexers 131.

At action 840, the method includes transmitting data from the write driver to a second inner memory bank through a fourth write multiplexer associated with the second inner memory bank. An example shown in FIGS. 1-2 in which the second inner memory bank is Bank 4, and it is served by multiplexers 112.

At action 850, the method includes transmitting data from the first outer memory bank through a first read multiplexer to a sense amplifier disposed in the centrally located controller. An example is shown in FIGS. 1-2 in which the first outer memory bank is served by multiplexers 121. Read data lines may couple the centrally located controller to the first read multiplexer, and those read data lines may be located in the metal layer that is routed across the first inner memory bank to the first outer memory bank.

At action 860, the method includes transmitting data from the first inner memory bank through a second read multiplexer to the sense amplifier. An example is shown in FIGS. 1-2 in which the first inner memory bank is served by multiplexers 111.

At action 870, the method includes transmitting data from the second outer memory bank through a third read multiplexer to the sense amplifier. An example is shown in FIGS. 1-2 in which the second outer memory bank is served by multiplexers 131. The data may be transmitted in read data lines that traverse the second inner memory bank in a metal layer across the second inner memory bank to the second outer memory bank.

At action 880, the method includes transmitting data from the second inner memory bank through a fourth read multiplexer to the sense amplifier. An example is shown in FIGS. 1-2 in which the second inner memory bank is served by multiplexers 112.

The scope of implementations is not limited to the specific actions shown in FIG. 8. Rather, other implementations may add, omit, rearrange, or modify one or more the actions. In one example, the memory circuit 100 may perform read and write operations in multiple banks simultaneously. In fact, the architecture of memory circuits 100, 400 may allow up to four read/write operations to be performed simultaneously by utilizing the four banks at the same time. However, there is no requirement that any particular number of banks must be read from or written to during any particular clock cycle.

Furthermore, an implementation may perform a read operation or a write operation each clock cycle or, at least, in subsequent non-consecutive cycles in one of the memory banks. The actions of method 800 may be performed as many times as appropriate to read or write requested data. When a wordline is driven, it allows a byte of data to be read from memory, where that byte of data is either written to or read from a physical location in the memory circuit corresponding to a logical location that is known to a CPU, GPU, or other processing device. Multiple clock cycles may be used to read or write multiple bytes of data with as many clock cycles used as appropriate for the size of the read or write request, and this is true for each of the memory banks.

Example implementations are described by the following numbered clauses:

1. A random access memory (RAM) comprising:
   a first memory bank, a second memory bank, a third memory bank, and a fourth memory bank, all coupled to a centrally located controller; and
   a write driver and a sense amplifier, in the centrally located controller, coupled to the first memory bank, the second memory bank, the third memory bank, and the fourth memory bank via a plurality of global bit lines;
   wherein the third memory bank is positioned between the first memory bank on one side of the centrally located controller and the centrally located controller, and wherein the fourth memory bank is positioned between the second memory bank on the other side of the centrally located controller and the centrally located controller;
   wherein at least one first read multiplexer and at least one first write multiplexer coupled to the first memory bank are disposed on a far side of the third memory bank with respect to the centrally located controller,
   further wherein the plurality of global bit lines includes a first plurality of read data lines and a first plurality of write data lines coupling the centrally located controller to the at least one first read multiplexer and the at least one first write multiplexer.

2. The RAM of clause 1, wherein the first plurality of read data lines and the first plurality of write data lines are disposed within a first metal layer across the third memory bank, the RAM further comprising:
   at least one second read multiplexer and at least one second write multiplexer coupled to the second memory bank, disposed on a far side of the fourth memory bank with respect to the centrally located controller, wherein the plurality of global bit lines further includes a second plurality of read data lines and a second plurality of write data lines coupling the centrally located controller to the at least one second read multiplexer and the at least one second write multiplexer, and the second plurality of read data lines and the second plurality of write data lines are disposed within a second metal layer across the fourth memory bank.
3. The RAM of clause 2, wherein the second metal layer is the first metal layer.
4. The RAM of any of clauses 1-3, wherein at least one of the first plurality of read data lines has a different width dimension than at least one of the first plurality of write data lines.
5. The RAM of any of clauses 1-4, wherein a total width dimension of the first plurality of read data lines is smaller than a total width dimension of the first plurality of write data lines.
6. The RAM of any of clauses 1-5, further comprising:
at least one third read multiplexer and at least one third write multiplexer coupled to the third memory bank and disposed at least partly between the third memory bank and the write driver and the sense amplifier.
7. The RAM of clause 6, wherein the at least one third read multiplexer and the at least one third write multiplexer are disposed in the centrally located controller.
8. The RAM of any of clauses 1-5, wherein the first memory bank comprises a top core and a bottom core, the bottom core being disposed between the top core and the third memory bank,
wherein the at least one first read multiplexer comprises a first read portion associated with the top core and a second read portion associated with the bottom core, and
wherein one of the first read portion and the second read portion is disposed between the top core and the bottom core.
9. The RAM of clause 8, wherein the other of the first read portion and the second read portion is disposed between the bottom core and the third memory bank.
10. The RAM of any of clauses 1-5, wherein the at least one first read multiplexer and the at least one first write multiplexer are disposed between the first memory bank and the third memory bank.
11. The RAM of any of clauses 1-10, further comprising:
at least one fourth read multiplexer and at least one fourth write multiplexer coupled to the fourth memory bank disposed at least partly between the fourth memory bank and the write driver and the sense amplifier.
12. The RAM of clause 11, wherein the at least one fourth read multiplexer and the at least one fourth write multiplexer are disposed in the centrally located controller.
13. The RAM of any of clauses 1-12, further comprising:
a first local data path coupled to the first memory bank, the first local data path including a first precharge circuit and the at least one first read multiplexer and the at least one first write multiplexer.
14. The RAM of clause 13, further comprising:
a second local data path coupled to the second memory bank, the second local data path including a second precharge circuit, the at least one second read multiplexer and the at least one second write multiplexer, wherein the at least one second read multiplexer and the at least one second write multiplexer are coupled to the plurality of global bit lines.
15. The RAM of clause 14, further comprising:
a third local data path associated with the third memory bank, the third local data path including a third precharge circuit, the at least one third read multiplexer and the at least one third write multiplexer, wherein the at least one third read multiplexer and the at least one third write multiplexer are coupled to the plurality of global bit lines and are disposed between the third memory bank and the write driver and the sense amplifier.
16. The RAM of clause 15, further comprising:
a fourth local data path associated with the fourth memory bank, the fourth local data path including a fourth precharge circuit, the at least one fourth read multiplexer and the at least one fourth write multiplexer, wherein the at least one fourth read multiplexer and the at least one fourth write multiplexer are coupled to the plurality of global bit lines, wherein the at least one fourth read multiplexer and the at least one fourth write multiplexer are disposed between the fourth memory bank and the write driver and the sense amplifier.
17. The RAM of any of clauses 1-16, further comprising:
a data-out latch coupled to the sense amplifier and disposed within the centrally located controller; and
a data-in latch coupled to the write driver and disposed within the centrally located controller.
18. The RAM of any of clauses 1-17, further comprising:
a header coupling a power supply to the third memory bank and to the fourth memory bank, wherein the header is disposed in the centrally located controller; and
an additional header coupling the power supply to the first memory bank, wherein the additional header is disposed between the first memory bank and the third memory bank.
19. The RAM of any of clauses 1-18, further comprising:
a first plurality of bit lines coupling the first read multiplexer to columns within the first memory bank; and
a second plurality of bit lines coupling a second read multiplexer to columns within the third memory bank.
20. A method of operating a random-access memory (RAM) having a first inner memory bank, a first outer memory bank, a second inner memory bank, second outer memory bank, and a controller disposed between the first inner memory bank and the second inner memory bank, the method comprising:
transmitting data from a write driver to the first outer memory bank through a first write multiplexer associated with the first outer memory bank, including: transmitting the data on a first plurality of write data lines that couple a controller of the RAM to the first write multiplexer; and
transmitting data from the write driver to the first inner memory bank through a second write multiplexer associated with the first inner memory bank, including: transmitting the data on a second plurality of write data lines that couple the controller to the second write multiplexer, wherein the second write multiplexer is disposed between the controller and the first inner memory bank.
21. The method of clause 20, wherein the first plurality of write data lines are located in a metal layer above the first inner memory bank.
22. The method of clause 21, further comprising:
transmitting data from the write driver to the second outer memory bank through a third write multiplexer associated with the second outer memory bank, including: transmitting the data on a third plurality of write data lines that couple the controller to the third write multiplexer, wherein the third plurality of write data lines are located in the metal layer above the second inner memory bank; and transmitting data from the write driver to the second inner memory bank through a fourth write multiplexer associated with the second inner memory bank, including: transmitting the data on a fourth plurality of write data lines that couple the controller to the fourth write multiplexer, wherein the fourth write multiplexer is disposed between the controller and the second inner memory bank.

23. The method of clause 21, further comprising:

transmitting data from the first outer memory bank through a first read multiplexer to a sense amplifier in the controller, including: transmitting the data on a first plurality of read data lines that couple the controller to the first read multiplexer, wherein the first plurality of read data lines are located in the metal layer above the first inner memory bank; and transmitting data from the first inner memory bank through a second read multiplexer to the sense amplifier, including: transmitting the data on a second plurality of read data lines that couple the controller to the second read multiplexer, wherein the second read multiplexer is disposed between the controller and the first inner memory bank.

24. The method of clause 23, further comprising:

transmitting data from the second outer memory bank through a third read multiplexer to the sense amplifier, including: transmitting the data on a third plurality of read data lines that couple the controller to the third read multiplexer, wherein the third plurality of read data lines are located in the metal layer above the second inner memory bank; and transmitting data from the second inner memory bank through a fourth read multiplexer to the sense amplifier, including: transmitting the data on a fourth plurality of read data lines that couple the controller to the fourth read multiplexer, wherein the fourth read multiplexer is disposed between the controller and the second inner memory bank.

25. A system on chip (SOC) comprising:

a random-access memory (RAM) having a first inner memory bank, a first outer memory bank, a second inner memory bank, and second outer memory bank, wherein the first inner memory bank is positioned between the first outer memory bank and a controller of the RAM, and wherein the second inner memory bank is positioned between the second outer memory bank and the controller of the RAM;

a distributed multiplexer system within the RAM, including a first outer multiplexer disposed on a first side of the first inner memory bank opposite the controller, a first inner multiplexer disposed between the first inner memory bank and a write driver and a sense amplifier of the controller of the RAM, a second inner multiplexer disposed between the second inner memory bank and the write driver and sense amplifier, and a second outer multiplexer disposed on a second side of the second inner memory bank opposite the controller;

a first plurality of data lines coupling the controller to the first outer multiplexer; and a second plurality of data lines coupling the controller to the first inner multiplexer.

26. The SOC of clause 25, wherein the first plurality of data lines traverse the first inner memory bank, and the second plurality of data lines are physically shorter than the first plurality of data lines.

27. The SOC of any of clauses 25-26, further comprising: a first plurality of bit lines coupling the first outer multiplexer to columns within the first outer memory bank.

28. The SOC of any of clauses 25-27, further comprising: a third plurality of data lines coupling the controller to the second outer multiplexer, the third plurality of data lines traversing the second inner memory bank.

29. The SOC of clause 28, further comprising:

a fourth plurality of data lines coupling the controller to the second inner multiplexer, the fourth plurality of data lines being physically shorter than the third plurality of data lines.

30. The SOC of clause 28, further comprising:

a second plurality of bit lines coupling the second outer multiplexer to columns within the second outer memory bank.

31. The SOC of any of clauses 25-30, wherein the first plurality of data lines includes a first read lines and a first write data lines, wherein the first read line has a different width than does the first write line.

32. The SOC of any of clauses 25-31, wherein the first outer multiplexer includes a first read multiplexer and a first write multiplexer, and wherein the first inner multiplexer includes a second read multiplexer and a second write multiplexer.

33. The SOC of clause 32, wherein the second outer multiplexer includes a third read multiplexer and a third write multiplexer, and wherein the second inner multiplexer includes a fourth read multiplexer and a fourth write multiplexer.

34. The SOC of any of clauses 25-33, wherein the first inner multiplexer and the second inner multiplexer are both disposed within the controller.

35. The SOC of any of clauses 25-34, further comprising:

a first local data path associated with the first outer memory bank, the first local data path including a first precharge circuit and the first outer multiplexer; and a second local data path associated with the first inner memory bank, the second local data path including a second precharge circuit and the first inner multiplexer.

36. A semiconductor device comprising:

a first outer memory bank, a second outer memory bank, a first inner memory bank, and a second inner memory bank, all coupled to a controller, wherein the first inner memory bank is positioned between the first outer memory bank and the controller, and wherein the second inner memory bank is positioned between the second outer memory bank and the controller;

means for writing data, disposed in the controller, and coupled to the first outer memory bank, the second outer memory bank, the first inner memory bank, and the second inner memory bank;

means for sensing data, disposed in the controller, and coupled to the first outer memory bank, the second outer memory bank, the first inner memory bank, and the second inner memory bank;

means for multiplexing data transmitted between the controller and the first outer memory bank, the second outer memory bank, the first inner memory bank, and the second inner memory bank, including:

first multiplexing means serving the first outer memory bank and disposed on a first side of the first inner memory bank opposite the controller;

second multiplexing means serving the first inner memory bank and disposed in the controller;

third multiplexing means serving the second outer memory bank and disposed on a second side of the second inner memory bank opposite the controller; and fourth multiplexing means serving the second inner memory bank and disposed in the controller; and means for carrying data between the controller and the first multiplexing means, the second multiplexing means, the third multiplexing means, and the fourth multiplexing means.

37. The semiconductor device of clause 36, wherein the means for carrying data comprises a first plurality of global bit lines between the controller and the first multiplexing means, wherein the means for carrying data are disposed within a metal layer above the first inner memory bank.

38. The semiconductor device of clause 37, wherein the means for carrying data further comprises a second plurality of global bit lines between the controller and the second multiplexing means, wherein the first plurality of global bit lines are physically shorter than the second plurality of global bit lines.

39. The semiconductor device of clause 37, wherein the first plurality of global bit lines comprises a first read data line and a first write data line, wherein the first read data line has a different length dimension than does the first write data line.

40. The semiconductor device of clause 37, wherein the first plurality of global bit lines comprises a first read data line and a first write data line, wherein the first read data line has a narrower width dimension than that of the first write data line.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A random access memory (RAM) comprising:
a first memory bank, a second memory bank, a third memory bank, and a fourth memory bank, all coupled to a centrally located controller; and
a sense amplifier, in the centrally located controller, coupled to the first memory bank, the second memory bank, the third memory bank, and the fourth memory bank;
wherein the third memory bank is positioned between the first memory bank and one side of the centrally located controller, and wherein the fourth memory bank is positioned between the second memory bank and another side of the centrally located controller;
a first read multiplexer coupled to a plurality of local bit lines for a plurality of columns of the first memory bank, the first read multiplexer being disposed adjacent a far side of the third memory bank with respect to the centrally located controller;
a first global read bit line coupled only between the first read multiplexer and the sense amplifier;
a second read multiplexer coupled to a plurality of local bit lines for a plurality of columns of the second memory bank, the second read multiplexer being disposed adjacent a far side of the fourth memory bank with respect to the centrally located controller;
a second global read bit line coupled only between the second read multiplexer and the sense amplifier;
a third read multiplexer coupled to a plurality of local bit lines for a plurality of columns of the third memory bank; the third read multiplexer being disposed at least partly between the third memory bank and the sense amplifier; and
a third global read bit line coupled only between the third read multiplexer and the sense amplifier.

2. The RAM of claim 1, wherein the first global read bit line is disposed within a first metal layer, and wherein the second global read bit line is disposed with the first metal layer.

3. The RAM of claim 1, further comprising:
a write driver in the centrally located controller;
a first write multiplexer coupled to the plurality of local bit lines of the first memory bank, the first write multiplexer being disposed adjacent the far side of the third memory bank with respect to the centrally located controller; and
a first global write bit line coupled between the first write multiplexer and the write driver.

4. The RAM of claim 3, wherein a total width dimension of the first global read bit line is smaller than a total width dimension of the first global write bit line.

5. The RAM of claim 3, further comprising:
a fourth read multiplexer coupled to a plurality of local bit lines for a plurality of columns of the fourth memory bank, the fourth read multiplexer being disposed at least partly between the fourth memory bank and the sense amplifier; and
a fourth global read bit line coupled between the fourth read multiplexer and the sense amplifier.

6. The RAM of claim 5, further comprising:
a second write multiplexer coupled to the plurality of local bit lines of the second memory bank, the second write multiplexer being disposed adjacent the far side of the fourth memory bank with respect to the centrally located controller; and
a second global write bit line coupled between the second write multiplexer and the write driver.

7. The RAM of claim 6, further comprising:
a first local data path coupled to the first memory bank, the first local data path including a first precharge circuit and the first read multiplexer and the first write multiplexer.

8. The RAM of claim 7, further comprising:
a second local data path coupled to the second memory bank, the second local data path including a second precharge circuit and the second read multiplexer and the second write multiplexer.

9. The RAM of claim 8, further comprising:
a third write multiplexer coupled to the plurality of local bit lines of the third memory bank; and
a third local data path associated with the third memory bank, the third local data path including a third precharge circuit and the third read multiplexer and the third write multiplexer.

10. The RAM of claim 9, further comprising:
a fourth write multiplexer coupled to the plurality of local bit lines of the fourth memory bank; and
a fourth local data path associated with the fourth memory bank, the fourth local data path including a fourth precharge circuit and the fourth read multiplexer and the fourth write multiplexer.

11. The RAM of claim 3, further comprising:
a data-out latch coupled to the sense amplifier and disposed within the centrally located controller; and
a data-in latch coupled to the write driver and disposed within the centrally located controller.

12. The RAM of claim 1, wherein the first memory bank comprises a top core and a bottom core, the bottom core being disposed between the top core and the third memory bank,
wherein the first read multiplexer comprises a first read portion associated with the top core and a second read portion associated with the bottom core, and
wherein one of the first read portion and the second read portion is disposed between the top core and the bottom core.

13. The RAM of claim 12, wherein the other of the first read portion and the second read portion is disposed between the bottom core and the third memory bank.

14. The RAM of claim 1, wherein the first read multiplexer is disposed between the first memory bank and the third memory bank.

15. The RAM of claim 1, further comprising:
a header coupling a power supply to the third memory bank and to the fourth memory bank, wherein the header is disposed in the centrally located controller; and
an additional header coupling the power supply to the first memory bank, wherein the additional header is disposed between the first memory bank and the third memory bank.

* * * * *